United States Patent
Okada

(10) Patent No.: US 12,009,454 B2
(45) Date of Patent: Jun. 11, 2024

(54) LIGHT EMITTING DEVICE

(71) Applicant: NICHIA CORPORATION, Anan (JP)

(72) Inventor: Takuya Okada, Anan (JP)

(73) Assignee: NICHIA CORPORATION, Anan (JP)

( * ) Notice: Subject to any disclaimer, the term of this patent is extended or adjusted under 35 U.S.C. 154(b) by 224 days.

(21) Appl. No.: 17/507,058

(22) Filed: Oct. 21, 2021

(65) Prior Publication Data

US 2022/0158025 A1 May 19, 2022

(30) Foreign Application Priority Data

Nov. 16, 2020 (JP) .................. 2020-190238

(51) Int. Cl.
*H01L 33/06* (2010.01)
*H01L 33/32* (2010.01)

(52) U.S. Cl.
CPC ............ *H01L 33/06* (2013.01); *H01L 33/325* (2013.01)

(58) Field of Classification Search
CPC .............................. H01L 33/06; H01L 33/325
See application file for complete search history.

(56) References Cited

U.S. PATENT DOCUMENTS

| | | | |
|---|---|---|---|
| 2009/0085054 A1* | 4/2009 | Jeon | H01L 33/06 257/101 |
| 2009/0179221 A1* | 7/2009 | Han | H01L 33/025 257/E33.028 |
| 2010/0044674 A1* | 2/2010 | Kim | H01L 33/04 257/14 |
| 2017/0025567 A1 | 1/2017 | Lu et al. | |
| 2017/0213868 A1 | 7/2017 | Damilano et al. | |

FOREIGN PATENT DOCUMENTS

| | | |
|---|---|---|
| JP | H11-177175 A | 7/1999 |
| JP | 2000-286509 A | 10/2000 |
| JP | 2001-077480 A | 3/2001 |
| JP | 2001-144378 A | 5/2001 |
| JP | 2009-088506 A | 4/2009 |
| JP | 2012-009625 A | 1/2012 |
| JP | 2017-028287 A | 2/2017 |
| JP | 2017-513225 A | 5/2017 |

\* cited by examiner

*Primary Examiner* — Mark W Tornow
(74) *Attorney, Agent, or Firm* — Foley & Lardner LLP

(57) ABSTRACT

A light-emitting device includes an n-side semiconductor layer comprising an n-type contact layer and an intermediate layer located on the n-type contact layer; an active layer located on the intermediate layer; and a p-side semiconductor layer located on the active layer. The intermediate layer includes at least one stacked portion comprising a first layer and a second layer. The first layer is an n-type nitride semiconductor layer comprising an n-type impurity, Al, and Ga. The second layer is a nitride semiconductor layer that includes Al and Ga, has a lower n-type impurity concentration than the first layer, and has a larger thickness than the first layer. An Al composition ratio of the first layer is higher than an Al composition ratio of the second layer.

20 Claims, 2 Drawing Sheets

LIGHT EMITTING DEVICE

CROSS-REFERENCE TO RELATED APPLICATION

This application claims priority to Japanese Patent Application No. 2020-190238, filed on Nov. 16, 2020, the disclosure of which is hereby incorporated by reference in its entirety.

BACKGROUND

The present disclosure relates to a light-emitting device. JP-A-2001-144378 and JP-A-2001-77480 disclose a light-emitting device in which multiple nitride semiconductor layers are stacked. In the light-emitting device using the nitride semiconductor, an improvement in reliability and light extraction efficiency is required.

SUMMARY

An object of certain embodiments of the present disclosure is to provide a light-emitting device that can improve reliability and light extraction efficiency.

According to one embodiment of the present disclosure, a light-emitting device includes an n-side semiconductor layer including an n-type contact layer, and an intermediate layer located on the n-type contact layer; an active layer located on the intermediate layer; and a p-side semiconductor layer located on the active layer. The intermediate layer includes at least one stacked portion including a first layer and a second layer. The first layer is an n-type nitride semiconductor layer including an n-type impurity, Al, and Ga. The second layer is a nitride semiconductor layer that includes Al and Ga, has a lower n-type impurity concentration than the first layer, and has a larger thickness than the first layer. An Al composition ratio of the first layer is higher than an Al composition ratio of the second layer.

According to certain embodiments of the present disclosure, it is possible to provide a light-emitting device that can improve reliability and light extraction efficiency.

DETAILED DESCRIPTION

Figure 1:
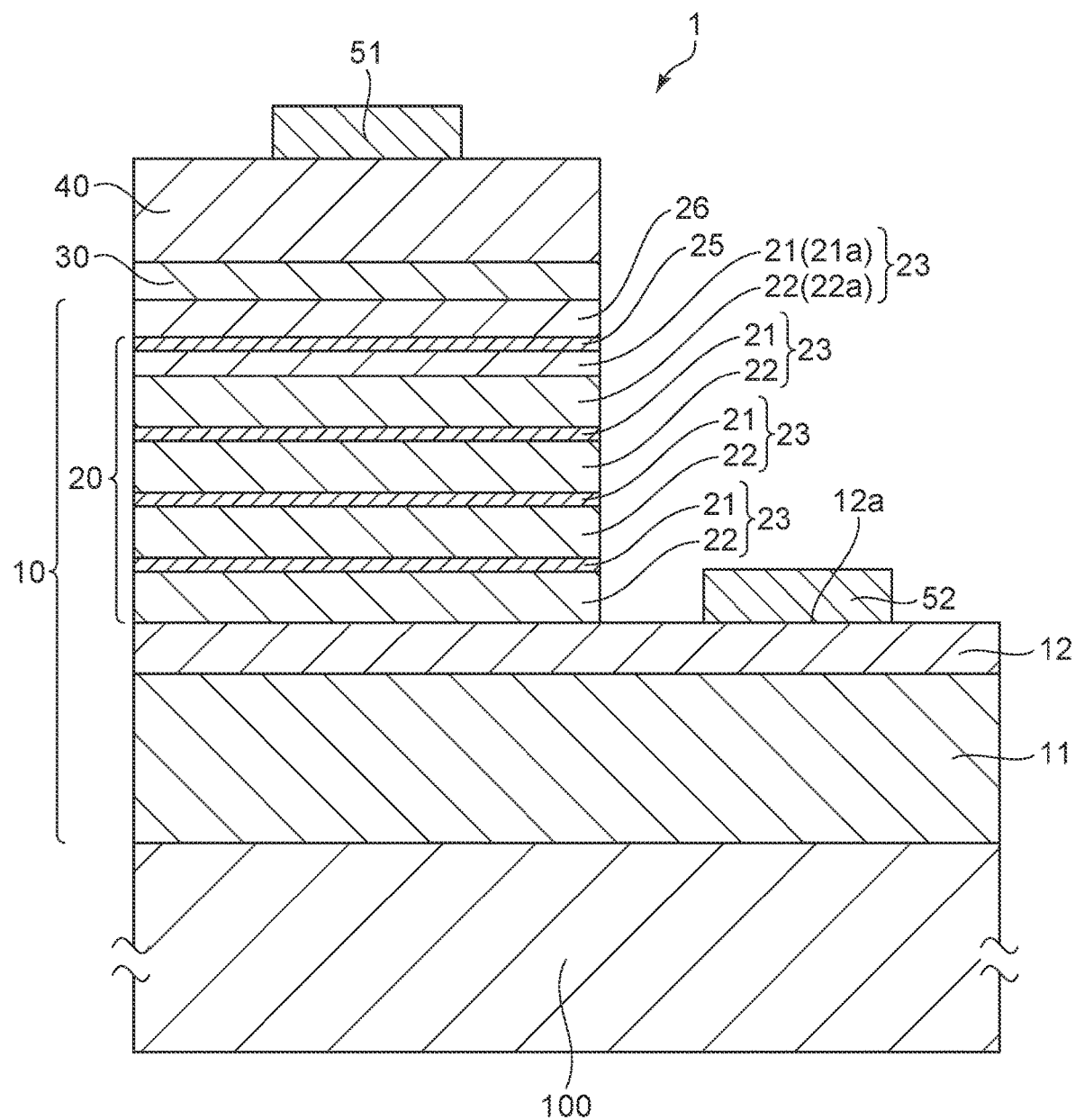
FIG. 1 is a schematic cross-sectional view illustrating a light-emitting device according to an embodiment of the present disclosure.

Embodiments will now be described with reference to the drawings. The same components in the drawings are labeled with the same reference numerals.

FIG. 1 is a schematic cross-sectional view illustrating a light-emitting device 1 according to an embodiment of the present disclosure.

The light-emitting device 1 includes a substrate 100, an n-side semiconductor layer 10 provided on the substrate 100, an active layer 30 provided on the n-side semiconductor layer 10, a p-side semiconductor layer 40 provided on the active layer 30, an n-side electrode 52 connected to the n-side semiconductor layer 10, and a p-side electrode 51 connected to the p-side semiconductor layer 40.

The n-side semiconductor layer 10, the active layer 30, and the p-side semiconductor layer 40 are layers made of nitride semiconductors. In the specification, the phrase "nitride semiconductors" includes, for example, all compositions of semiconductors obtained by changing each of composition ratios x and y in their ranges in a chemical formula $In_xAl_yGa_{1-x-y}N$ ($0 \leq x \leq 1$, $0 \leq y \leq 1$, $x+y \leq 1$). In addition, the phrase "nitride semiconductors" also includes semiconductors that further include group-V elements other than nitrogen (N) and semiconductors that further include various elements added to control various physical properties, such as conductivity types, in the chemical formula.

The substrate 100 is, for example, a sapphire substrate. The n-side semiconductor layer 10, the active layer 30, and the p-side semiconductor layer 40 are sequentially grown on the substrate 100 by, for example, a metal organic chemical vapor deposition (MOCVD) method. When a sapphire substrate is used as the substrate 100, a nitride semiconductor layer is grown on, for example, a C-face of the sapphire substrate.

The n-side semiconductor layer 10 includes a foundation layer 11, an n-type contact layer 12 provided on the foundation layer 11, an intermediate layer 20 provided on the n-type contact layer 12, and a superlattice layer 26 provided on the intermediate layer 20.

The intermediate layer 20 includes at least one stacked portion 23 including a first layer 21 and a second layer 22. In the embodiment, the intermediate layer 20 includes multiple stacked portions 23. Therefore, the intermediate layer 20 includes multiple first layers 21 and multiple second layers 22. The first layer 21 and the second layer 22 are alternately stacked. For example, in one stacked portion 23, the first layer 21 is provided on the second layer 22. The intermediate layer 20 includes, for example, three or more and seven or less stacked portions 23. In the embodiment, the intermediate layer 20 includes four stacked portions 23.

The first layer 21 is an n-type nitride semiconductor layer including an n-type impurity, Al, and Ga. The first layer 21 is, for example, an n-type AlGaN layer. The first layer 21 includes, for example, silicon (Si) as the n-type impurity. The n-type impurity concentration of the first layer 21 is lower than the n-type impurity concentration of the n-type contact layer 12. The n-type impurity concentration of the first layer 21 is, for example, $1 \times 10^{17}/cm^3$ or more and $1 \times 10^{18}/cm^3$ or less.

The second layer 22 is a nitride semiconductor layer including Al and Ga. The n-type impurity concentration of the second layer 22 is lower than the n-type impurity concentration of the first layer 21. The second layer 22 is, for example, an undoped AlGaN layer. Here, the undoped semiconductor layer is a layer that is formed without using a raw material gas (for example, gas including Si or Mg) for intentional doping with impurities for controlling conductivity and may include impurities that are inevitably mixed in the process. The n-type impurity concentration of the undoped semiconductor layer is, for example, $1 \times 10^{17}/cm^3$ or less.

The thickness of the second layer 22 is greater than the thickness of the first layer 21. For example, the general formula of the first layer 21 is $Al_{a1}Ga_{1-a1}N$ ($0<a1<1$), and the general formula of the second layer 22 is $Al_{a2}Ga_{1-a2}N$ ($0<a2<1$). An Al composition ratio a1 of the first layer 21 is higher than an Al composition ratio a2 of the second layer 22.

The n-side semiconductor layer 10 further includes the superlattice layer 26 provided between the intermediate layer 20 and the active layer 30. The superlattice layer 26 has a stacked structure in which multiple semiconductor layers having different lattice constants are alternately stacked. The superlattice layer 26 includes, for example, multiple GaN layers and multiple InGaN layers. In the superlattice layer 26, the GaN layers and the InGaN layers are alternately stacked. For example, the superlattice layer 26 includes 15 or more and 25 or less stacked portions each of which includes the GaN layer and the InGaN layer. The thickness of one stacked portion including the GaN layer and the InGaN layer in the superlattice layer 26 is less than the thickness of one stacked portion 23 in the intermediate layer 20. For example, the thickness of one GaN layer included in the superlattice layer 26 is 1 nm or more and 3 nm or less. For example, the thickness of one InGaN layer included in the superlattice layer 26 is 1 nm or more and 3 nm or less.

The active layer 30 is a light-emitting layer that emits light. The active layer 30 has, for example, a multiple quantum well (MQW) structure that has multiple well layers and multiple barrier layers. For example, the well layer is an InGaN layer, and the barrier layer is a GaN layer. For example, the emission peak wavelength of the active layer 30 is about 430 nm or more and 540 nm or less. The active layer 30 emits blue light or green light. The bandgap energy of the well layer in the active layer 30 is lower than the bandgap energy of each layer in the intermediate layer 20.

The p-side semiconductor layer 40 includes a p-type nitride semiconductor layer. The p-type nitride semiconductor layer is, for example, a GaN layer including magnesium (Mg) as a p-type impurity.

The p-side electrode 51 is provided on the p-side semiconductor layer 40. The p-side electrode 51 is electrically connected to the p-side semiconductor layer 40.

The n-type contact layer 12 has an n-side contact surface 12a on which the intermediate layer 20, the superlattice layer 26, the active layer 30, and the p-side semiconductor layer 40 are not provided. The n-side electrode 52 is provided on the n-side contact surface 12a of the n-type contact layer 12. The n-side electrode 52 is electrically connected to the n-side semiconductor layer 10. The n-type contact layer 12 is, for example, a GaN layer including an n-type impurity. The n-type impurity concentration of the n-type contact layer 12 is, for example, $3\times10^{18}/\text{cm}^3$ or more and $3\times10^{20}/\text{cm}^3$ or less.

The light emitted from the active layer 30 is transmitted through the n-side semiconductor layer 10 and is mainly extracted from a lower surface and a side surface of the substrate 100. In addition, the substrate 100 may be removed. When the substrate 100 is removed, the light emitted from the active layer 30 is mainly extracted from a lower surface of the n-side semiconductor layer 10.

According to the embodiment, since the n-side semiconductor layer 10 is provided with the intermediate layer 20 including the AlGaN layer having a higher bandgap energy than the well layer in the active layer 30, it is possible to reduce light absorption in the n-side semiconductor layer 10 and to improve the light extraction efficiency of the light-emitting device 1.

The intermediate layer 20 includes the n-type first layer 21 including, for example, Si as the n-type impurity. Therefore, even when the p-type impurity (for example, Mg) included in the p-side semiconductor layer 40 is diffused to the n-side semiconductor layer 10, it is possible to reduce the change of the n-type semiconductor layer (for example, the n-type contact layer 12) included in the n-side semiconductor layer 10 to the p type.

Si doped in the AlGaN layer is substituted with a group-III element included in the AlGaN layer. It is considered that, because the atomic radius of Si is closer to the atomic radius of Al in the nitride semiconductor than the atomic radius of Ga in the nitride semiconductor, crystal defects are less likely to occur in the AlGaN layer in which Si is substituted with Al instead of Ga. Therefore, in the embodiment, the Al composition ratio of the first layer 21 having a higher n-type impurity concentration than the second layer 22 is higher than the Al composition ratio of the second layer 22 such that Si is more likely to be substituted with Al in the AlGaN layer, which makes it possible to reduce the occurrence of crystal defects in the intermediate layer 20. As a result, it is possible to increase the crystallinity of the intermediate layer 20 and to improve the reliability of the light-emitting device 1.

As the Al composition ratio of the nitride semiconductor layer increases, crystal defects tend to increase. For example, the general formula of the first layer 21 is $Al_{a1}Ga_{1-a1}N$ (0<a1<1), and the general formula of the second layer 22 is $Al_{a2}Ga_{1-a2}N$ (0<a2<1). It is favorable that the Al composition ratio a1 of the first layer 21 and the Al composition ratio a2 of the second layer 22 are 0.01 or less in order to reduce the absorption of light from the active layer 30 while reducing the occurrence of crystal defects. Since the Al composition ratios a of the first layer 21 and the second layer 22 are set to 1 or less, it is possible to improve the light extraction efficiency while reducing the deterioration of reliability caused by an increase in crystal defects. Further, it is favorable that the difference between the Al composition ratio a1 of the first layer 21 and the Al composition ratio a2 of the second layer 22 is 0.001 or more and 0.002 or less.

In addition, because the intermediate layer 20 includes the undoped second layer 22 and the thickness of the second layer 22 is greater than the thickness of the n-type first layer 21, it is possible to reduce the destruction rate of the light-emitting device 1 due to electro-static discharge (ESD) and to improve the reliability of the light-emitting device 1. For example, it is favorable that the thickness of the second layer 22 is 10 times or more the thickness of the first layer 21. For example, the thickness of the first layer 21 is 1 nm or more and 5 nm or less. For example, the thickness of the second layer 22 is 50 nm or more and 100 nm or less.

The Al composition ratio of a first layer 21a located closest to the active layer 30 among the multiple first layers 21 is higher than the Al composition ratio of the other first layers 21. For example, the general formula of the first layer 21a is $Al_{a3}Ga_{1-a3}N$ (0<a3<1), and an Al composition ratio a3 of the first layer 21a is higher than the Al composition ratio a1 of the other first layers 21. Therefore, it is possible to increase the effect of reducing light absorption in a region, which is close to the active layer 30 and through which a larger amount of light propagates, in the intermediate layer 20 and to improve the light extraction efficiency.

The n-type impurity concentration of the first layer 21a located closest to the active layer 30 among the multiple first layers 21 is higher than the n-type impurity concentration of the other first layers 21. The n-type impurity concentration of a second layer 22a located closest to the active layer 30 among the multiple second layers 22 is higher than the n-type impurity concentration of the other second layers 22. The n-type impurity concentration of a region which is closer to the p-side semiconductor layer 40 in the intermediate layer 20 is relatively increased to effectively reduce the change of, for example, the n-type contact layer 12 to the p type. In addition, when the Al composition ratio of the first layer 21a located closest to the active layer 30 among the multiple first layers 21 is higher than the Al composition ratio of the other first layers 21, it is presumed that Si is more likely to be substituted with Al in the AlGaN layer due to an increase in the n-type impurity concentration of the first layer 21a. Therefore, it is possible to further increase the crystallinity of the intermediate layer 20 and to further improve the reliability of the light-emitting device 1. The n-type impurity concentration of the first layer 21a located closest to the active layer 30 among the multiple first layers 21 is, for example, $3 \times 10^{18}$/cm$^3$ or more and $3 \times 10^{19}$/cm$^3$ or less.

In addition, when the uppermost layer of the intermediate layer 20 includes a high concentration of impurities, the flatness of the uppermost layer of the intermediate layer 20 is likely to deteriorate, and the crystallinity of, for example, the active layer 30 stacked on the intermediate layer 20 is also affected by the high concentration of impurities. Therefore, according to the embodiment, the intermediate layer 20 further includes a nitride semiconductor layer 25 that is provided between the first layer 21a located closest to the active layer 30 and the active layer 30. The nitride semiconductor layer 25 is an n-type AlGaN layer that has a lower n-type impurity concentration than the first layer 21a located closest to the active layer 30 and includes, for example, Al and Ga. This makes it possible to reduce the deterioration of the flatness of the uppermost layer of the intermediate layer 20 and to improve the crystallinity of, for example, the active layer 30 stacked on the intermediate layer 20. Alternatively, the nitride semiconductor layer 25 may be an undoped AlGaN layer.

The Al composition ratio of the nitride semiconductor layer 25 is about equal to the Al composition ratio of the first layer 21a located closest to the active layer 30.

The multiple first layers 21 and the multiple second layers 22 in the intermediate layer 20 are formed, for example, in a state in which gas containing gallium, gas containing aluminum, and gas containing nitrogen are introduced into a furnace and are heated in the furnace. For example, the gas containing gallium is trimethylgallium (TMG) gas, the gas containing aluminum is trimethylaluminum (TMA) gas, and the gas containing nitrogen is ammonia (NH$_3$) gas. When the first layer 21 is formed, gas containing silicon is further introduced into the furnace.

For example, the multiple first layers 21 and the multiple second layers 22 are stacked on the n-type contact layer 12 while the temperature in the furnace is reduced from 1100° C. to 1050° C. As the temperature in the furnace becomes lower, Al is more likely to be combined with N, and the first layer 21 which is an upper layer closer to the active layer 30 among the multiple first layers 21 has a higher Al composition ratio.

Figure 2:
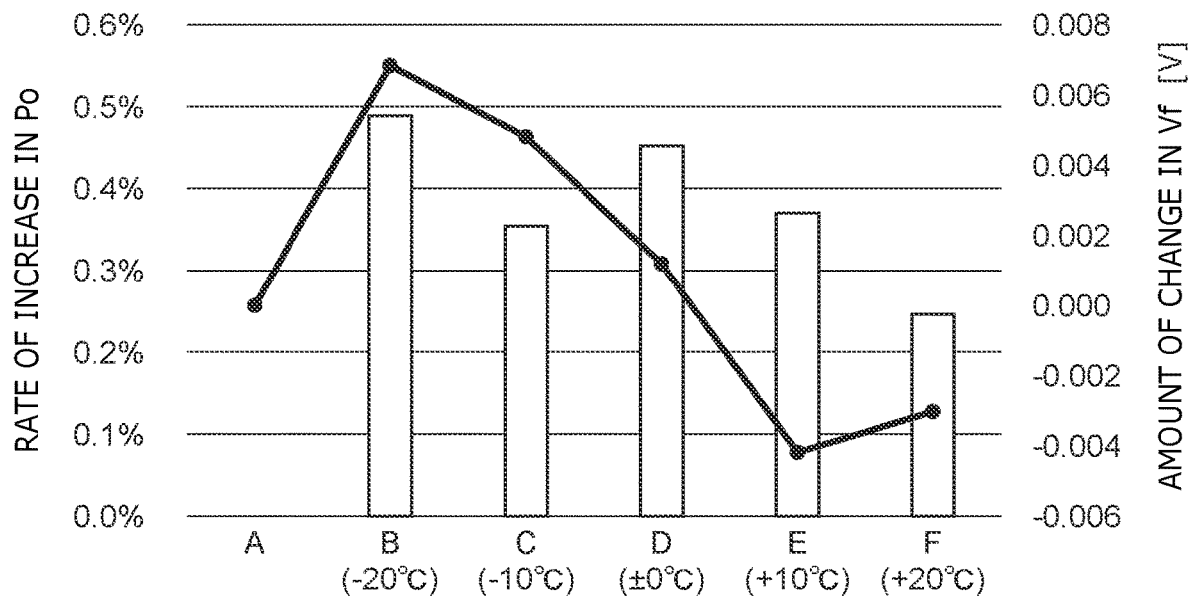
FIG. 2 is a graph illustrating a characteristic evaluation result of a light-emitting device.
Figure 3:
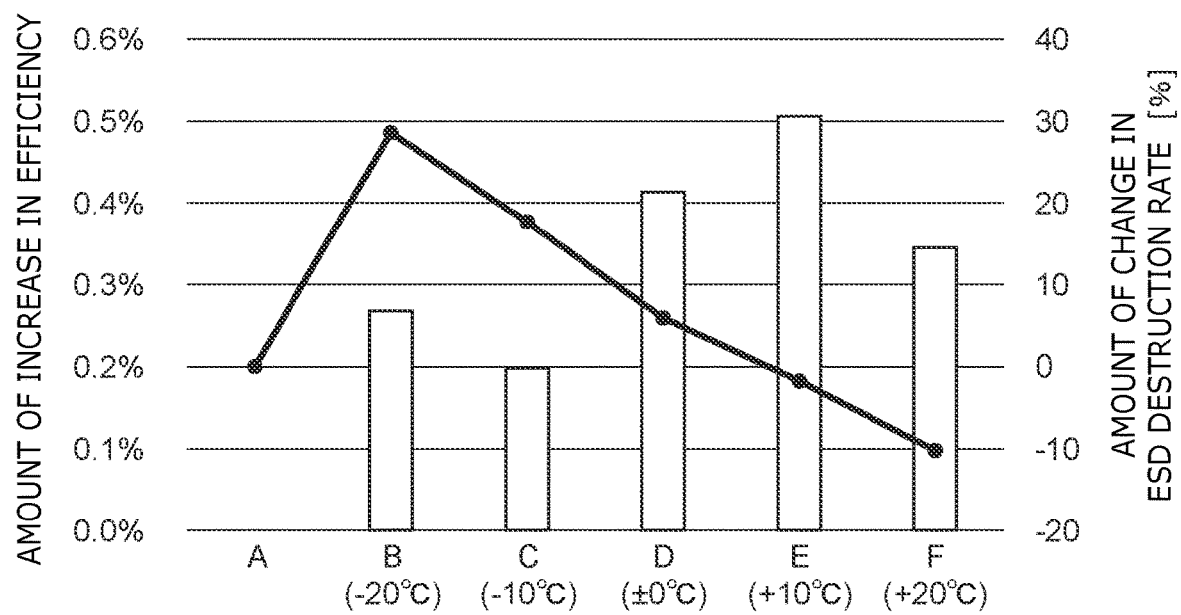
FIG. 3 is a graph illustrating a characteristic evaluation result of a light-emitting device.

FIGS. 2 and 3 are graphs illustrating the characteristic evaluation results of the light-emitting device.

The characteristics of six samples A to F were evaluated. In the samples B to F, in the structure illustrated in FIG. 1, the first layer 21 in the intermediate layer 20 is a Si-doped AlGaN layer, and the second layer 22 is an undoped AlGaN layer. The intermediate layer 20 includes four stacked portions 23 each of which includes the first layer 21 and the second layer 22. The thickness of the first layers 21 other than the first layer 21a located closest to the active layer 30 among the multiple first layers 21 is about 3.3 nm, and the thickness of the first layer 21a located closest to the active layer 30 among the multiple first layers 21 is about 30 nm. The thickness of the second layer 22 is about 75 nm. In addition, the nitride semiconductor layer 25 is an AlGaN layer doped with Si which has a thickness of about 5 nm. The flow rate of the gas containing aluminum introduced when each layer of the intermediate layer 20 and the nitride semiconductor layer 25 are formed is the same.

The sample A has the same structure as the samples B to F except that the first layer 21 and the second layer 22 in the intermediate layer 20 in the samples B to F are formed not as AlGaN layers but as GaN layers.

In the samples B to F, the temperatures in the furnace when the intermediate layer 20 is formed are different. The temperatures in the samples B to F are changed on the basis of the temperature when the intermediate layer of the sample A is formed. In the sample B, the intermediate layer 20 was grown at a temperature that was 20° C. lower than that in the sample A. In the sample C, the intermediate layer 20 was grown at a temperature that was 10° C. lower than that in the sample A. In the sample D, the intermediate layer 20 was grown at the same temperature as that in the sample A. In the sample E, the intermediate layer 20 was grown at a temperature that was 10° C. higher than that in the sample A. In the sample F, the intermediate layer 20 was grown at a temperature that was 20° C. higher than that in the sample A.

A vertical axis on the left side in FIG. 2 indicates the rate of increase in an output Po based on the output Po (0%) of the sample A, and this characteristic is represented by a bar graph in FIG. 2.

A vertical axis on the right side in FIG. 2 indicates the amount of change in a forward voltage Vf based on the forward voltage Vf (0) of the sample A, and this characteristic is represented by a line graph in FIG. 2.

A vertical axis on the left side in FIG. 3 indicates the amount of increase in luminous efficiency based on the luminous efficiency (0%) of the sample A, and this characteristic is represented by a bar graph in FIG. 3.

A vertical axis on the right side in FIG. 3 indicates the amount of change in the electro-static discharge (ESD) destruction rate based on the ESD destruction rate (0) of the sample A, and this characteristic is represented by a line graph in FIG. 3.

The results illustrated in FIG. 2 show that the rate of increase in the output Po of the samples B to F is higher than that of the sample A. It is presumed that this is because light absorption is reduced by changing each layer included in the intermediate layer 20 from the GaN layer to the AlGaN layer, which results in an improvement in light extraction efficiency. In the samples B and C, the forward voltage Vf is higher than that in the sample A. In the samples D to F, the forward voltage Vf is equal to or lower than that in the sample A. It is considered that this is because the crystallinity of each layer formed is lowered by setting the temperature in the furnace when the intermediate layer 20 is formed to be lower than that in the sample A. On the other hand, it is presumed that, when the temperature in the furnace increases, the crystallinity of each layer formed is improved and the effect of reducing the forward voltage Vf is obtained. In addition, it is considered that, in a case in which each layer of the intermediate layer 20 is the GaN layer, when the temperature in the furnace is too high, the flatness of the surface of the GaN layer tends to deteriorate and it is difficult to obtain the effect of reducing the forward voltage Vf due to an increase in the temperature in the furnace as in the samples E and F. In the samples D to F, the output Po can be higher than that in the sample A while the forward voltage Vf is equal to or less than that in the sample A.

The results illustrated in FIG. 3 show that the luminous efficiency in the samples B to F is higher than that in the sample A. In particular, the luminous efficiency in the samples D to F is 0.3% or more higher than that in the sample A. In the samples B and C, the ESD destruction rate is higher than that in the sample A. In the samples D to F, the ESD destruction rate is equal to or lower than that in the sample A. It is considered that this is because the change in the temperature in the furnace affects the crystallinity of each layer of the intermediate layer 20 as described above. In particular, in the samples E and F, the temperature in the furnace is higher than that in the sample A, which makes it possible to improve the crystallinity of each layer of the intermediate layer 20 and to reduce the ESD destruction rate. In the samples D to F, the luminous efficiency can be higher than that in the sample A while the ESD destruction rate is equal to or lower than that in the sample A.

Embodiments of the present invention have been described with reference to specific examples. However, the present invention is not limited to these specific examples. Based on the above-described embodiments of the present invention, all embodiments that can be implemented with appropriately design modification by one skilled in the art are also within the scope of the present invention as long as the gist of the present invention is included. Further, within the scope of the spirit of the present invention, one skilled in the art can conceive various modifications, and the modifications fall within the scope of the present invention.

What is claimed is:

1. A light-emitting device comprising:
an n-side semiconductor layer comprising an n-type contact layer, and an intermediate layer located on the n-type contact layer;
an active layer located on the intermediate layer;
a p-side semiconductor layer located on the active layer; and
an n-side electrode contacting the n-type contact layer, wherein:
the intermediate layer comprises at least one stacked portion comprising a first layer and a second layer,
the first layer is an n-type nitride semiconductor layer comprising an n-type impurity, Al, and Ga,
the second layer is a nitride semiconductor layer that comprises Al and Ga, and has a larger thickness than the first layer,
an n-type impurity concentration of the first layer is lower than an n-type impurity concentration of the n-type contact layer,
an n-type impurity concentration of the second layer is lower than the n-type impurity concentration of the first layer, and
an Al composition ratio of the first layer is higher than an Al composition ratio of the second layer.

2. The device according to claim 1,
wherein the at least one stacked portion comprises a plurality of the stacked portions.

3. The device according to claim 2,
wherein an Al composition ratio of a first layer located closest to the active layer, among a plurality of first layers of the plurality of stacked portions, is higher than an Al composition ratio of other first layers of the plurality of first layers.

4. The device according to claim 3,
wherein an n-type impurity concentration of a first layer located closest to the active layer, among a plurality of first layers of the plurality of stacked portions, is higher than an n-type impurity concentration of other first layers of the plurality of first layers.

5. The device according to claim 4,
wherein the intermediate layer further comprises a nitride semiconductor layer that is located between the first layer located closest to the active layer and the active layer, has a lower n-type impurity concentration than the first layer located closest to the active layer, and comprises Al and Ga.

6. The device according to claim 3,
wherein an n-type impurity concentration of a second layer located closest to the active layer, among a plurality of second layers of the plurality of stacked portions, is higher than an n-type impurity concentration of other second layers of the plurality of stacked portions.

7. The device according to claim 3,
wherein the thickness of the second layer is 10 times or more the thickness of the first layer.

8. The device according to claim 3,
wherein the thickness of the second layer is 50 nm or more and 100 nm or less.

9. The device according to claim 3,
wherein the first layer is made of $Al_{a1}Ga_{1-a1}N$ ($0<a1<1$), the second layer is made of $Al_{a2}Ga_{1-a2}N$ ($0<a2<1$), and an Al composition ratio a1 of the first layer and an Al composition ratio a2 of the second layer are 0.01 or less.

10. The device according to claim 2,
wherein an n-type impurity concentration of a first layer located closest to the active layer, among a plurality of first layers of the plurality of stacked portions, is higher than an n-type impurity concentration of other first layers of the plurality of first layers.

11. The device according to claim 10,
wherein the intermediate layer further comprises a nitride semiconductor layer that is located between the first layer located closest to the active layer and the active layer, has a lower n-type impurity concentration than the first layer located closest to the active layer, and comprises Al and Ga.

12. The device according to claim 10,
wherein an n-type impurity concentration of a second layer located closest to the active layer, among a plurality of second layers of the plurality of stacked portions, is higher than an n-type impurity concentration of other second layers of the plurality of stacked portions.

13. The device according to claim 2,
wherein an n-type impurity concentration of a second layer located closest to the active layer, among a plurality of second layers of the plurality of stacked portions, is higher than an n-type impurity concentration of other second layers of the plurality of stacked portions.

14. The device according to claim 2,
wherein the thickness of the second layer is 10 times or more the thickness of the first layer.

15. The device according to claim 2,
wherein the thickness of the second layer is 50 nm or more and 100 nm or less.

16. The device according to claim 2,
wherein the first layer is made of $Al_{a1}Ga_{1-a1}N$ ($0<a1<1$), the second layer is made of $Al_{a2}Ga_{1-a2}N$ ($0<a2<1$), and an Al composition ratio a1 of the first layer and an Al composition ratio a2 of the second layer are 0.01 or less.

17. The device according to claim 1,
wherein the n-type impurity is silicon.

18. The device according to claim 1,
wherein the thickness of the second layer is 10 times or more the thickness of the first layer.

19. The device according to claim 1,
wherein the thickness of the second layer is 50 nm or more and 100 nm or less.

20. The device according to claim 1,
wherein the first layer is made of $Al_{a1}Ga_{1-a1}N$ ($0<a1<1$),
the second layer is made of $Al_{a2}Ga_{1-a2}N$ ($0<a2<1$), and
an Al composition ratio a1 of the first layer and an Al composition ratio a2 of the second layer are 0.01 or less.

* * * * *